United States Patent

Makabe

(10) Patent No.: US 7,781,131 B2
(45) Date of Patent: Aug. 24, 2010

(54) POSITIVE PHOTOSENSITIVE RESIN COMPOSITION, CURED LAYER, PROTECTING LAYER, INSULATING LAYER AND SEMICONDUCTOR DEVICE AND DISPLAY THEREWITH

(75) Inventor: Hiroaki Makabe, Shinagawa-ku (JP)

(73) Assignee: Sumitomo Bakelite Co., Ltd., Tokyo (JP)

(*) Notice: Subject to any disclaimer, the term of this patent is extended or adjusted under 35 U.S.C. 154(b) by 0 days.

(21) Appl. No.: 12/194,634

(22) Filed: Aug. 20, 2008

(65) Prior Publication Data

US 2009/0068584 A1    Mar. 12, 2009

(30) Foreign Application Priority Data

Aug. 21, 2007    (JP) .............................. 2007-214227

(51) Int. Cl.
*G03F 7/004*    (2006.01)

(52) U.S. Cl. ..................... 430/18; 430/165; 430/191; 430/192; 430/193; 430/270.1

(58) Field of Classification Search .................. 430/18, 430/165, 191, 192, 193, 270.1
See application file for complete search history.

(56) References Cited

U.S. PATENT DOCUMENTS

| | | | | |
|---|---|---|---|---|
| 6,887,643 B2 * | 5/2005 | Fujita et al. | .................. | 430/191 |
| 6,908,717 B2 * | 6/2005 | Hirano et al. | .................. | 430/18 |
| 2004/0142275 A1 * | 7/2004 | Komatsu | .................. | 430/270.1 |
| 2007/0072122 A1 * | 3/2007 | Nunomura et al. | ........ | 430/270.1 |

FOREIGN PATENT DOCUMENTS

| | | |
|---|---|---|
| JP | 1-46862 | 10/1989 |
| JP | 2004-93816 | 3/2004 |
| JP | 2005-10764 | 1/2005 |
| JP | 2007-191571 | 8/2007 |
| WO | WO 2005/109099 A1 | 11/2005 |

* cited by examiner

*Primary Examiner*—John S Chu
(74) *Attorney, Agent, or Firm*—Obon, Spivak, McClelland, Maier & Neustadt, L.L.P.

(57) ABSTRACT

A positive-type photosensitive resin composition comprises (A) an alkali-soluble resin having at least a polybenzoxazole precursor structure, (B) a sensitizer, and (C) a cyclic compound having an alcoholic hydroxyl group. A protecting layer and an insulating layer include a cured layer which is a cured product of the positive-type photosensitive resin composition. A semiconductor device and a display device include the cured layer. According to the present invention, a highly reliable positive-type photosensitive resin composition can be obtained even when cured at a low temperature.

10 Claims, No Drawings

POSITIVE PHOTOSENSITIVE RESIN COMPOSITION, CURED LAYER, PROTECTING LAYER, INSULATING LAYER AND SEMICONDUCTOR DEVICE AND DISPLAY THEREWITH

BACKGROUND OF THE INVENTION

1. Field of the Invention

The present invention relates to a positive-type photosensitive resin composition, a cured layer, a protecting layer, and an insulating layer, and a semiconductor device and a display device using the layers.

2. Description of Related Art

A polyimide resin possessing excellent heat resistance and superior electrical and mechanical properties has been used for a surface protecting layer and interlayer dielectric of semiconductor chips. These days, a polybenzoxazole resin having excellent wet resistance reliability due to absence of a carbonyl group originating from a high polar imide ring is used in the latest semiconductor chips. A photosensitive resin composition comprising a polybenzoxazole resin or a polyimide resin which is provided with photosensitivity to simplify a part of a patterning process has been developed. The resin composition has an effect of shortening the process and increasing the yield.

More recently, a positive-type photosensitive resin composition which can be developed using an alkaline aqueous solution has been developed from the viewpoint of safety. For example, Patent Document 1 discloses a positive-type photosensitive resin composition which comprises a polybenzoxazole precursor as a base resin and a diazoquinone compound as a sensitizer. The composition has high heat resistance, outstanding electrical properties, and microfabricability and has a possibility of being used not only as a wafer coating material, but also as a resin composition for interlayer insulation. The development mechanism of the positive-type photosensitive resin composition is as follows. The diazoquinone compound in the unexposed area is insoluble in an alkaline aqueous solution. The base resin is provided with resistance to the alkaline aqueous solution as a result of an interaction with the diazoquinone compound. On the other hand, if exposed to light, the diazoquinone compound changes chemically and becomes soluble in an alkaline aqueous solution, and promotes dissolution of the base resin. A coated layer pattern consisting only of the resin in the unexposed area can be prepared by removing the exposed area by dissolution using the solubility difference of the exposed area and unexposed area patterning.

The polybenzoxazole precursor resin in the positive-type photosensitive resin composition from which the coating-layer pattern has been formed is dehydrated by ring-closing by curing at a temperature of about 300° C., whereby the precursor resin ultimately turns into a polybenzoxazole resin having high heat resistance. Remarkable miniaturization and high integration of semiconductor chips in recent years has reduced heat resistance, particularly of storage chips. In order to increase the yield, a polybenzoxazole precursor resin which can be cured at a lower temperature is demanded. The cyclization rate of the resin after curing is an important factor when curing the resin at a low temperature. A low cyclization rate causes a problem in reliability of the semiconductor device due to alkali-soluble groups remaining in the resin. Patent Document 2, for example, discloses a positive-type photosensitive resin composition comprising an alkali-soluble polyamide which has a polybenzoxazole precursor structure and a thermal latent acid generator. Wiring of the semiconductor chip is corroded by an acid generated with heat. Thus, the resin composition has the same problem of poor reliability.

Therefore, development of a positive-type photosensitive resin composition which satisfies reliability when cured at a low temperature is strongly desired.

[Patent Document 1] Japanese Patent Publication No. 1-46862

[Patent Document 2] WO2005/109099

SUMMARY OF THE INVENTION

The present invention has been achieved in view of the above-mentioned circumstance and has an object of providing a positive-type photosensitive resin composition, a protecting layer, an interlayer dielectric, a semiconductor device, and a display chip having high reliability when cured at a low temperature.

This object can be attained in the present invention by the following [1] to [12].

[1] A positive-type photosensitive resin composition comprising (A) an alkali-soluble resin having at least a polybenzoxazole precursor structure, (B) a sensitizer, and (C) a cyclic compound having an alcoholic hydroxyl group.

[2] The positive-type photosensitive resin composition according to [1], wherein the cyclic compound having an alcoholic hydroxyl group (C) is either an alicyclic compound having an alcoholic hydroxyl group or a heterocyclic compound having an alcoholic hydroxyl group.

[3] The positive-type photosensitive resin composition according to [1], wherein the cyclic compound having an alcoholic hydroxyl group (C) is one or more compounds selected from the group consisting of the compounds shown by the following formula (1),

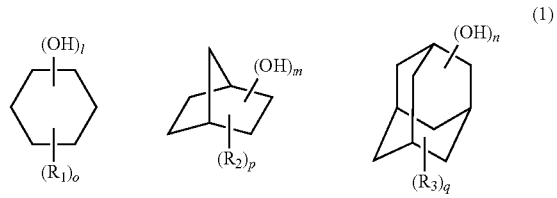

wherein $R_1$, $R_2$, and $R_3$ represent organic groups, when two or more $R_1$s are present, the $R_1$s may be either the same or different, when two or more $R_2$s are present, the $R_2$s may be either the same or different, when two or more $R_3$s are present, the $R_3$s may be either the same or different, l, m and n are individually an integer of 1 to 3, and o, p, and q are individually an integer of 0 to 3.

[4] The positive-type photosensitive resin composition according to [1], wherein the cyclic compound having an alcoholic hydroxyl group (C) is an alicyclic compound with 6 to 18 carbon atoms having an alcoholic hydroxyl group.

[5] The positive-type photosensitive resin composition according to [1], comprising 5 to 30 parts by weight of the cyclic compound having an alcoholic hydroxyl group (C) for 100 parts by weight of the alkali-soluble resin having a polybenzoxazole precursor structure (A).

[6] The positive-type photosensitive resin composition according to [1], wherein the sensitizer (B) is a photosensitive diazo quinone compound.

[7] The positive-type photosensitive resin composition according to [1], wherein at least a part of the sensitizer (B) is an ester of a phenolic compound and 1,2-naphthoquinone-2-diazido-4-sulfonic acid.

[8] A cured layer consisting of the cured product of the positive-type photosensitive resin composition according to [1].

[9] A protecting layer consisting of the cured film layer according to [8].

[10] An insulating layer consisting of the cured layer according to [8].

[11] A semiconductor device having the cured layer according to [8].

[12] A display device having the cured layer according to [8].

According to the present invention, a positive-type photosensitive resin composition, a protecting layer, an interlayer dielectric, a semiconductor device, and a display element having high reliability when cured at a low temperature can be provided.

DETAILED DESCRIPTION OF THE INVENTION AND PREFERRED EMBODIMENTS

Preferred embodiments of the positive-type photosensitive resin composition, the cured layer, the protecting layer, the insulating layer, the semiconductor device, and the display device according to the present invention are described in detail below.

The positive-type photosensitive resin composition of the present invention comprises (A) an alkali-soluble resin having a polybenzoxazole precursor structure (hereinafter may be referred to as "alkali-soluble resin (A)", a sensitizer (B), and a cyclic compound having an alcoholic hydroxyl group (hereinafter may be referred to as "cyclic compound (C)").

The alkali-soluble resin (A) used in the present invention is a resin having a benzoxazole precursor structure in the main chain. From the viewpoint of ensuring excellent sensitivity and resolution when forming a coated layer pattern, and ensuring excellent heat resistance and mechanical strength of the cured layer, a resin having a benzoxazole precursor structure and an imide structure in the main chain and further having a hydroxyl group, a carboxyl group, an ether group, or an ester group in the main chain or a side chain; a resin having a benzoxazole precursor structure and an imide precursor structure in the main chain; and a resin having a benzoxazole precursor structure and an amide ester structure in the main chain are preferable as the alkali-soluble resin (A). As an example of the alkali-soluble resin (A), a resin shown by the following formula (2) can be given.

$-SO_2-$, $-CO-$, $-NHCO-$, and $-C(CF_3)_2-$. $R_5$ is an alkyl group, an alkoxy group, an acyloxy group or a cycloalkyl group, and if there are two or more $R_5$s, the $R_5$s may be either the same or different. $R_6$ indicates $-O-R_8-$ and if there are two or more $R_6$s, the $R_6$s may be either the same or different. $R_7$ is a hydroxyl group, a carboxyl group, $-O-R_8-$, or $-COO-R_8-$ and if there are two or more $R_7$s, the $R_7$s may be either the same or different. $R_8$ represents an organic group having 1 to 15 carbon atoms. r is an integer of 0 to 3, t is an integer of 0 to 2, s is an integer of 0 to 4, and u is an integer of 0 to 4. a and b indicate the molar ratio by percentage respectively of the structural unit shown by the formula (2-1) and the structural unit shown by the formula (2-2) in the alkali-soluble resin (A), wherein a+b=100, a is 30 to 100, and b is 0 to 70. In the formula (2), a and b indicate the mol percent respectively of the structural unit shown by the formula (2-1) and the structural unit shown by the formula (2-2) in the alkali-soluble resin (A), but do not indicate that these structural units are continuous. The alkali-soluble resin (A) shown by the formula (2) includes structures derived by ring-closing of part of the benzoxazole precursor structure, amide acid ester structure, or imide precursor structure in the formula (2).

As specific examples of the alkylene group and the substituted alkylene shown by $R_4$ in the structural unit shown by the formula (2-1), $-CH_2-$, $-CH(CH_3)-$, $-C(CH_3)_2-$, $-CH(CH_2CH_3)-$, $-C(CH_3)(CH_2CH_3)-$, $-C(CH_2CH_3)(CH_2CH_3)-$, $-CH(CH_2CH_2CH_3)-$, $-C(CH_3)(CH_2CH_2CH_3)-$, $-CH(CH(CH_3)_2)-$, $-C(CH_3)(CH(CH_3)_2)-$, $-CH(CH_2CH_2CH_2CH_3)-$, $-C(CH_3)(CH_2CH_2CH_2CH_3)-$, $-CH(CH_2CH(CH_3)_2)-$, $-C(CH_3)(CH_2CH(CH_3)_2)-$, $-CH(CH_2CH_2CH_2CH_2CH_3)-$, $-C(CH_3)(CH_2CH_2CH_2CH_2CH_3)-$, $-CH(CH_2CH_2CH_2CH_2CH_2CH_3)-$, $-C(CH_3)(CH_2CH_2CH_2CH_2CH_2CH_3)-$, and the like can be given. Of these, $-CH_2-$, $-CH(CH_3)-$, and $-C(CH_3)_2-$ which can produce an alkali-soluble resin (A) exhibiting sufficient solubility not only in an alkaline aqueous solution, but also in a solvent, in a well-balanced manner are preferable.

In the alkali-soluble resin (A) shown by the formula (2), $-O-R_8$ as the substituent of X, and $-O-R_8$ and $-COO-R_8$ as the substituent of Y are groups in which a hydroxyl group or a carboxyl group is protected by $R_8$ which is an organic group having 1 to 15 carbon-atoms so as to adjust the solubility of the hydroxyl group or carboxyl group

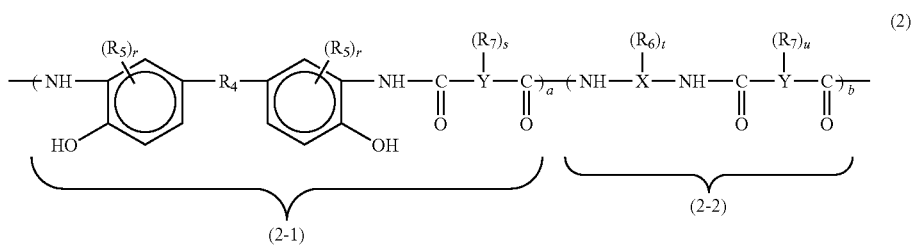

(2)

The alkali-soluble resin (A) shown by the formula (2) is a copolymer resin in which the structural unit shown by the formula (2-1) and the structural unit shown by the formula (2-2) are randomly bonded via an amide bond.

In the formula (2), X and Y are organic groups. $R_4$ is a group selected from the group consisting of an alkylene group, a substituted alkylene group, $-O-$, $-S-$, in an alkaline aqueous solution. In the alkali-soluble resin (A) shown by the formula (2), the hydroxyl group or the carboxyl group may be protected as required. As examples of $R_8$, a formyl group, a methyl group, an ethyl group, a propyl group, an isopropyl, a tert-butyl group, a tert-butoxycarbonyl group, a phenyl group, a benzyl group, a tetrahydrofuranyl group, a tetrahydropyranyl group, and the like can be given.

The alkali-soluble resin (A) shown by the formula (2) may be obtained, for example, by reacting a bis(aminophenol) which is a polymerization raw material from which the structure originating from diamine in the structural unit shown by the formula (2-1) is derived, optionally a diamine which is a polymerization raw material from which the structure originating from the diamine including X in the structural unit shown by the formula (2-2) is derived, and a compound selected from the group consisting of tetracarboxylic dianhydride, trimellitic anhydride, dicarboxylic acid, dicarboxylic acid dichloride, dicarboxylic acid derivatives, hydroxydicarboxylic acid, hydroxydicarboxylic acid derivatives, and the like, which are polymerization raw materials from which a structure originating from an acid including Y in the structural unit shown by the formula (2-1) and the structural unit shown by the formula (2-2) are derived. In the case of the dicarboxylic acid, an active ester-type dicarboxylic acid derivative previously reacted with 1-hydroxy-1,-2,3-benzotriazole or the like may be used in order to increase the reaction yield.

The structure originating from a diamine in the structural unit shown by the formula (2-1) is shown by the following formula (2-1-1).

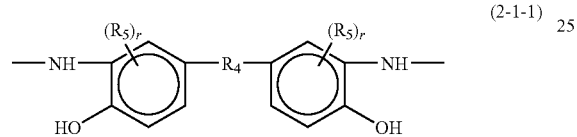

(2-1-1)

As more specific structures of the (2-1-1), the structures shown by the following formula (3) can be given. These may be used either individually or in combination of two or more.

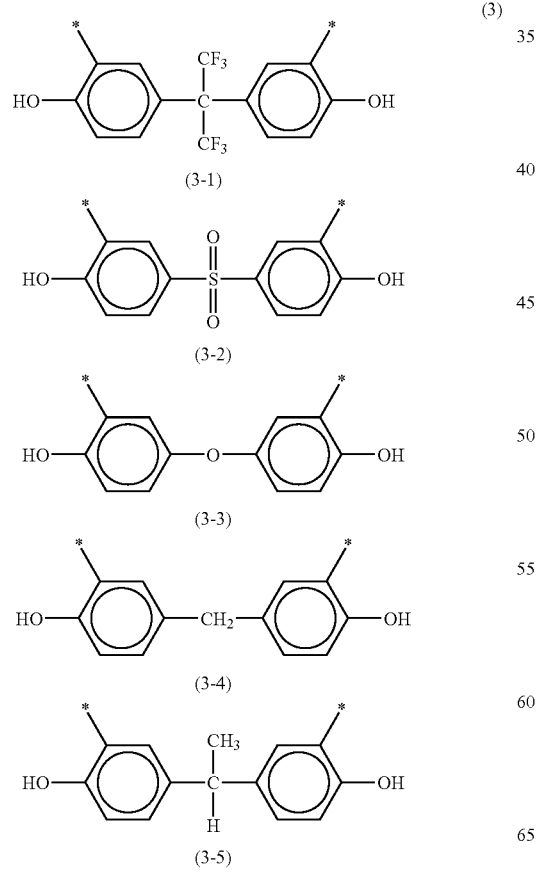

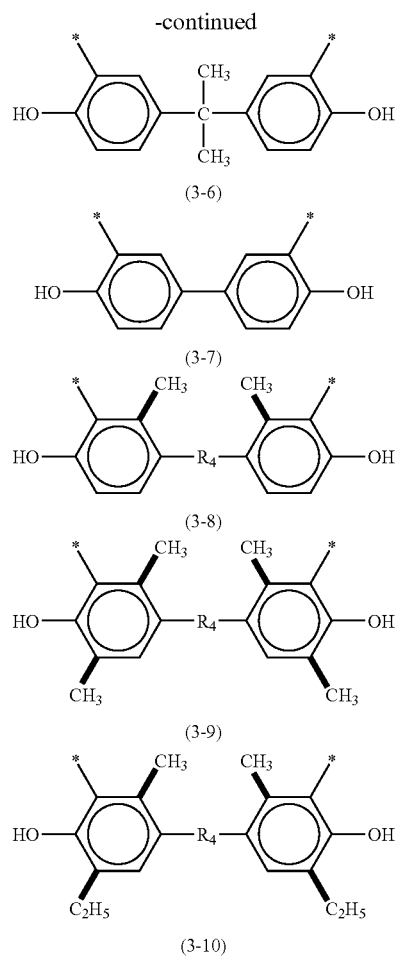

wherein * indicates —NH and $R_4$ is a group selected from the group consisting of an alkylene group, a substituted alkylene group, —O—, —S—, —SO$_2$—, —CO—, —NHCO—, —C(CF$_3$)$_2$—, and a single bond.

As shown in the formulas (2) and (2-1-1), the structures shown by the formula (2-1-1) have 0 to 6 $R_5$s. These $R_5$s are omitted in the structures shown in the formula (3).

As examples of X in the structural unit shown by the formula (2-2), an aromatic ring such as a benzene ring and a naphthalene ring, a bisphenol skeleton, a heterocyclic skeleton such as a pyrrole skeleton and a furan skeleton, a siloxane skeleton, and the like can be given. More specific examples of such a structure include the structures shown by the following formula (4). These salts may be used either individually or in combination of two or more.

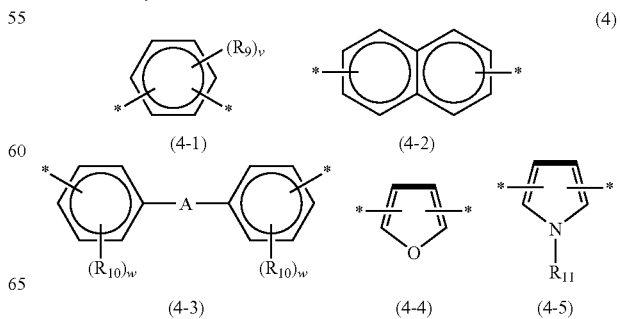

-continued

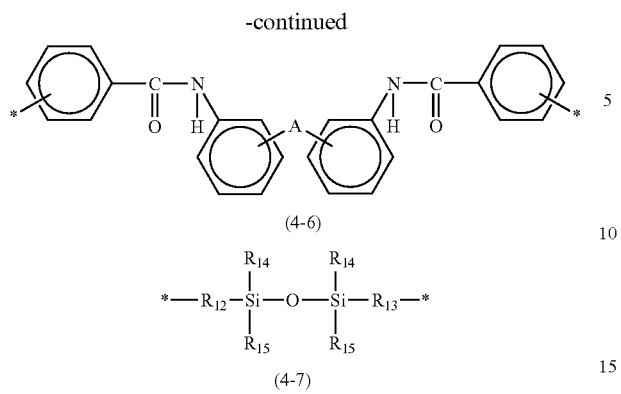

(4-6)

(4-7)

wherein * indicates —NH, A indicates —CH$_2$—, —C(CH$_3$)$_2$—, —O—, —S—, —SO$_2$—, —CO—, —NHCO—, —C(CF$_3$)$_2$—, or a single bond, R$_9$ is an alkyl group, an alkyl ester group, or a halogen atom, and if there are two or more R$_9$s, the R$_9$s may be either the same or different, R$_{10}$ is an alkyl group, an alkoxy group, an acyloxy group or a cycloalkyl group, and if there are two or more R$_{10}$s, the R$_{10}$s may be either the same or different. R$_{11}$ is a hydrogen atom, an alkyl group, an alkyl ester group, or a halogen atom, v is an integer of 0 to 2, and w is an integer of 0 to 3, and R$_{12}$ to R$_{15}$ represent organic groups.

As shown in the formulas (2), X has 0 to 2 R$_6$s bonded thereto. These R$_6$s are omitted in the structures shown in the formula (4).

As particularly preferable examples of the structures shown in the formula (4), the structures shown in the following formulas (5) and (6) can be given.

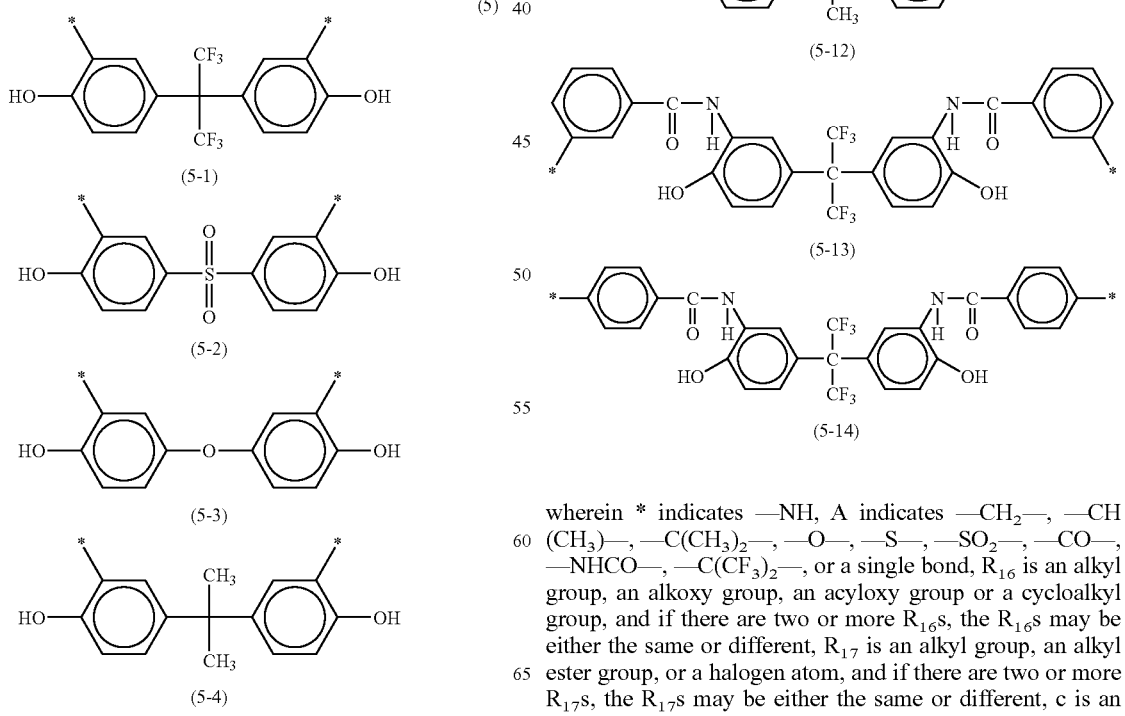

wherein * indicates —NH, A indicates —CH$_2$—, —CH(CH$_3$)—, —C(CH$_3$)$_2$—, —O—, —S—, —SO$_2$—, —CO—, —NHCO—, —C(CF$_3$)$_2$—, or a single bond, R$_{16}$ is an alkyl group, an alkoxy group, an acyloxy group or a cycloalkyl group, and if there are two or more R$_{16}$s, the R$_{16}$s may be either the same or different, R$_{17}$ is an alkyl group, an alkyl ester group, or a halogen atom, and if there are two or more R$_{17}$s, the R$_{17}$s may be either the same or different, c is an integer of 1 to 3, and d is an integer of 0 to 2.

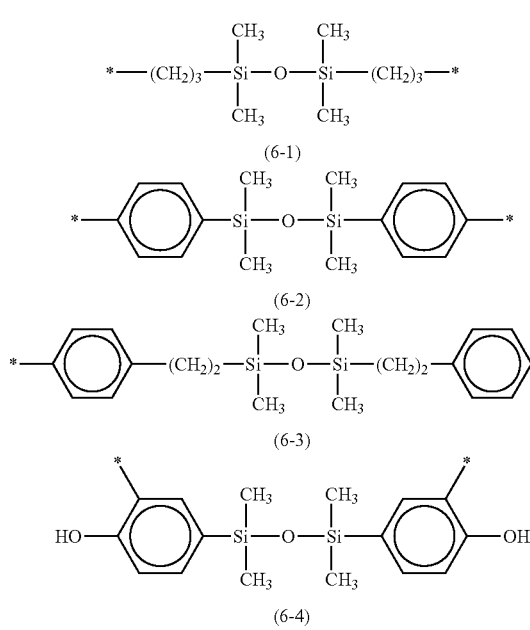

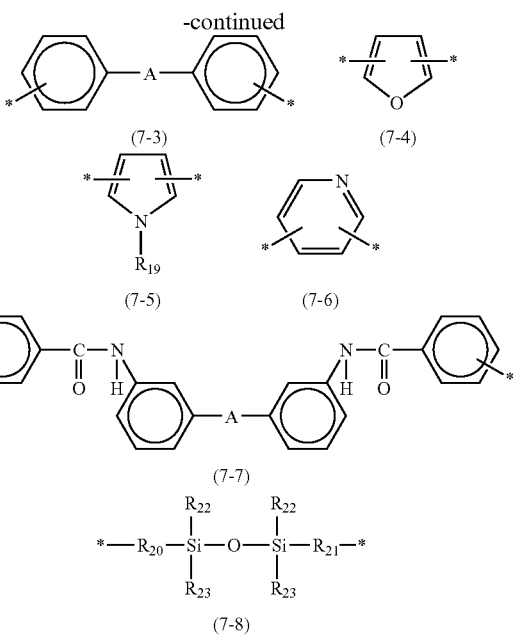

wherein * indicates —NH.

As shown in the formula (2), X has 0 to 2 $R_6$s bonded thereto. These $R_6$s are omitted in the structures shown in the formulas (5) and (6).

Y in the structural unit shown by the formula (2-1) and the structural unit shown by the formula (2-2) is an organic group, and the same groups as previously given as examples of X, for example, an aromatic ring such as a benzene ring and a naphthalene ring, a bisphenol skeleton, and a heterocyclic skeleton such as a pyrrole skeleton and a furan skeleton, may be given as examples. More specific examples of such a structure include the structures shown by the following formula (7). These groups may be used either individually or in combination of two or more.

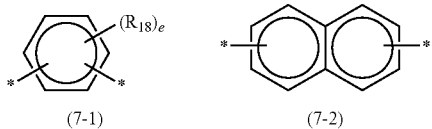

wherein * indicates —C=O, A indicates —CH$_2$—, —CH(CH$_3$)—, —C(CH$_3$)$_2$—, —O—, —S—, —SO$_2$—, —CO—, —NHCO—, —C(CF$_3$)$_2$—, or a single bond, $R_{18}$ is an alkyl group, an alkyl ester group, or a halogen atom, and if there are two or more $R_{18}$s, the $R_{18}$s may be either the same or different, $R_{19}$ is an alkyl group, an alkyl ester group, or a halogen atom, e is an integer of 0 to 2, and $R_{20}$ to $R_{23}$ represent organic groups.

As shown in the formulas (2), Y has 0 to 4 $R_7$s bonded thereto. These $R_7$s are omitted in the structures shown in the formula (7).

As particularly preferable examples of the structures shown in the formula (7), the structures shown in the following formula (8) can be given.

As the structure originating from tetracarboxylic dianhydride in the following formula (8), although those in which the both positions bonding to the C=O group are meta-positions and those in which the both positions bonding to the C=O group are para-positions are given, the structure may include those in which one of the positions is a meta-position and the other is a para-position.

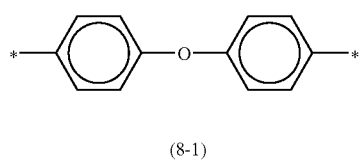

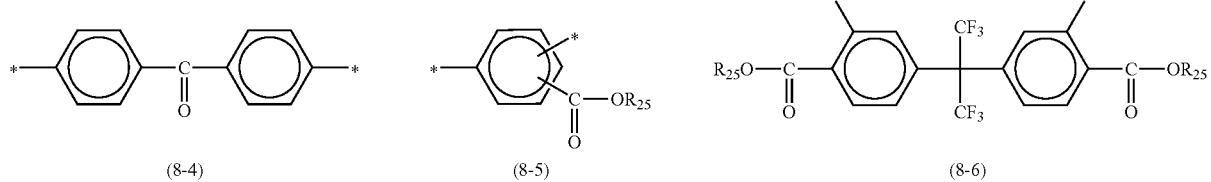

-continued
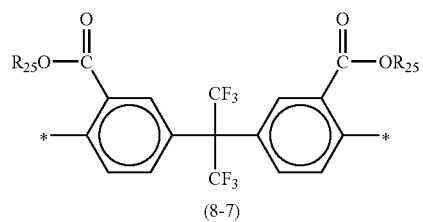
(8-7)
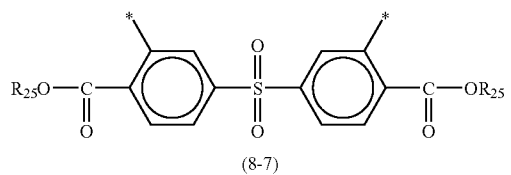
(8-7)
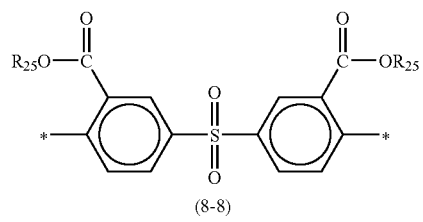
(8-8)
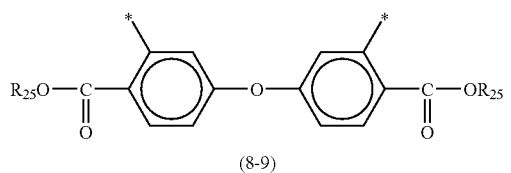
(8-9)
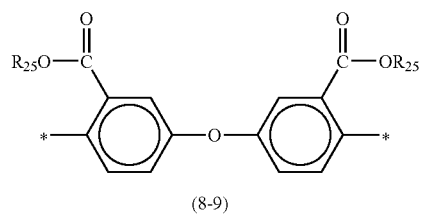
(8-9)
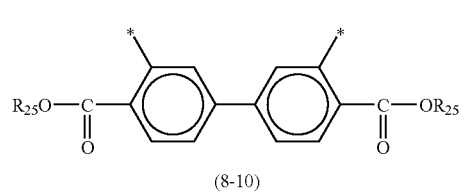
(8-10)
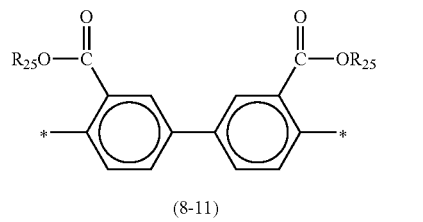
(8-11)
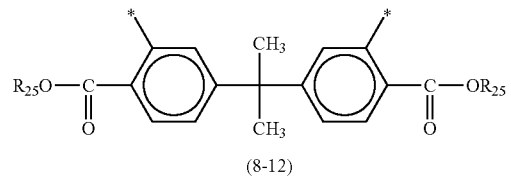
(8-12)
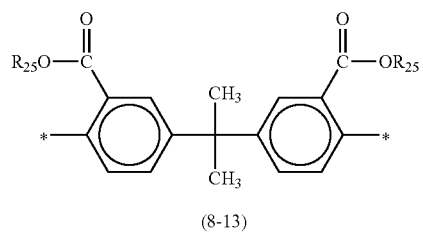
(8-13)
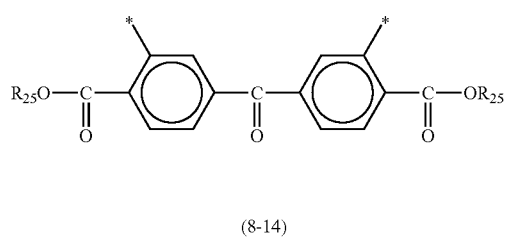
(8-14)
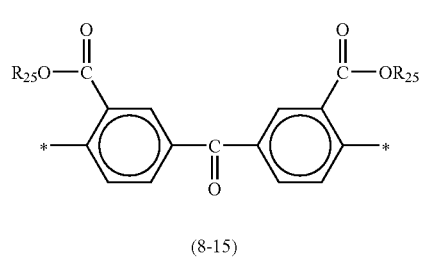
(8-15)
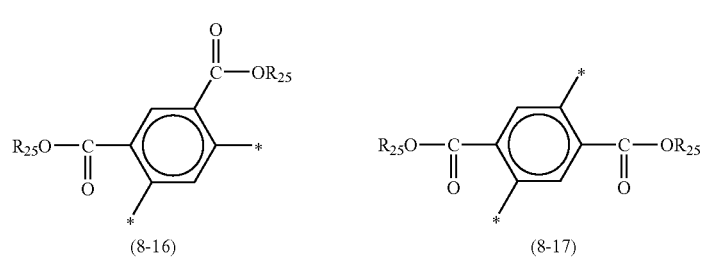
(8-16)　(8-17)
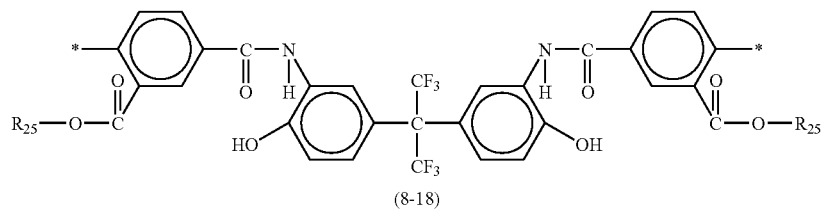
(8-18)

-continued

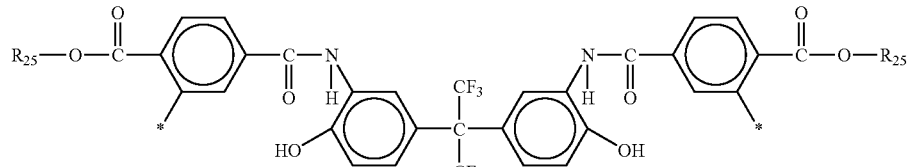
(8-19)

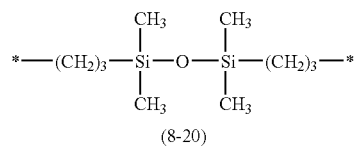
(8-20)

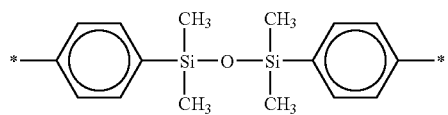
(8-21)

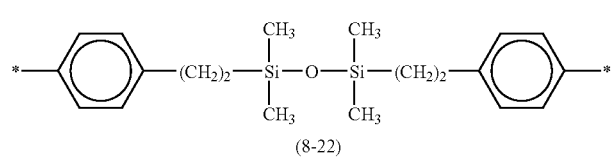
(8-22)

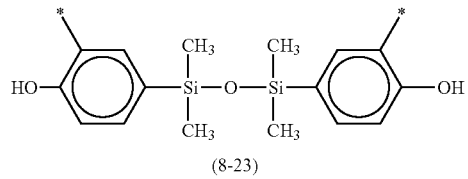
(8-23)

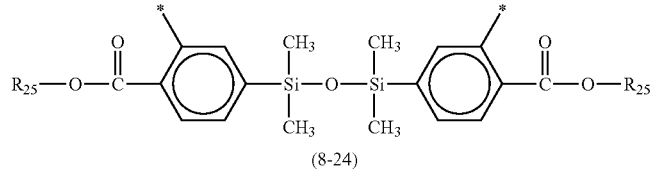
(8-24)

wherein * indicates —C=O, $R_{24}$ is an alkyl group, an alkyl ester group, an alkyl ether group, a benzyl ether group, or a halogen atom, and if there are two or more $R_{24}$s, the $R_{24}$s may be either the same or different, $R_{25}$ is a hydrogen atom or an organic group having 1 to 15 carbon atoms, of which a part may be substituted, and f is an integer of 0 to 2.

The symbol b in the formula (2) is the mol percent of the structural unit shown by the formula (2-2) and may be 0.

The amino group at the terminal of the alkali-soluble resin (A) shown by the formula (2) may be capped as an amide using an acid anhydride containing an aliphatic group having at least one alkenyl group or alkynyl group, or an acid anhydride containing a cyclic compound group having at least one alkenyl group or alkynyl group. The storage stability may be improved in this manner. As examples of the group originating from such an acid anhydride which includes at least one aliphatic group or a cyclic compound group having at least one alkenyl group or alkynyl group after reacting with an amino group, the groups shown in the following formula (9) or formula (10) can be given. These groups may be used either individually or in combination of two or more.

(9)

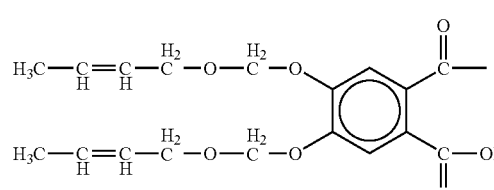

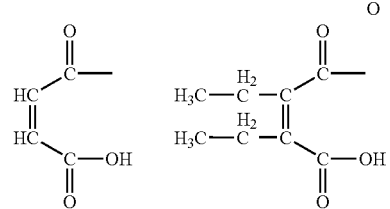

-continued

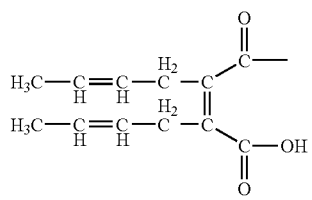

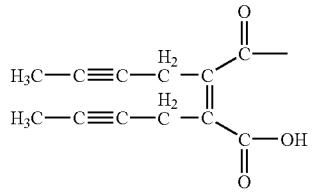

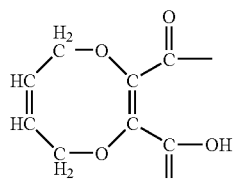
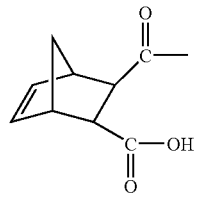

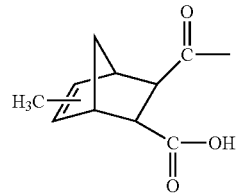

-continued

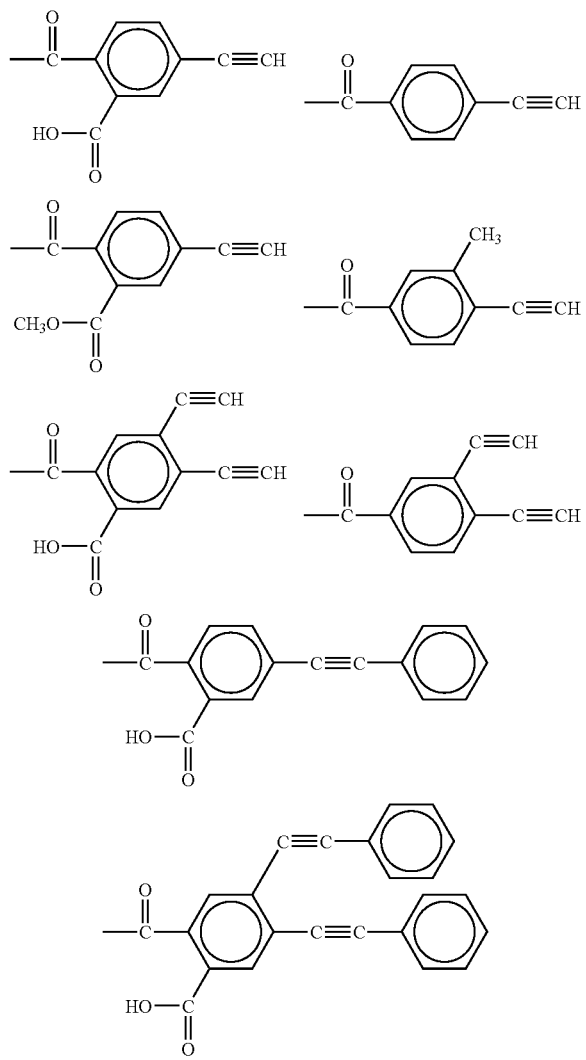

Among these groups, the groups shown by the following formula (11) are particularly preferable. The storage stability may be particularly improved by using these groups.

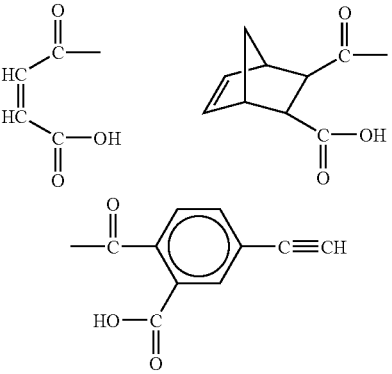

Without being limited to this method, an acid at the terminal of the alkali-soluble resin (A) may be capped as an amide using an amine derivative containing an aliphatic group having at least one alkenyl group or alkynyl group, or an amine derivative containing a cyclic compound group having at least one alkenyl group or alkynyl group.

The sensitizer (B) used in the present invention is a compound which generates an acid on being irradiated with light. As examples of such a sensitizer, onium salts such as diphenyliodonium salt and triphenylsulfonium salts, 2-nitrobenzyl esters, N-imino sulfonates, aryl sulfonic acid esters, heterocyclic compounds having a halogen such as chlorine, and photosensitive diazoquinone compounds can be given. Of these compounds, photosensitive diazoquinone compounds which moderately absorb actinic rays mainly used in exposure process and provide good sensitivity are preferable.

As examples of the photosensitive diazoquinone compound, esters of a phenolic compound and 1,2-naphthoquinone-2-diazido-5-sulfonic acid or 1,2-naphthoquinone-2-diazido-4-sulfonic acid can be given. An ester of a phenolic compound and 1,2-naphthoquinone-2-diazido-4-sulfonic acid which exhibits better catalytic activity in the reaction of the alkali-soluble resin (A) and the cyclic compound (C) described latter is more preferable. As specific examples, compounds shown by the following formulas (12) to (15) can be given. These groups may be used either individually or in combination of two or more.

(12)

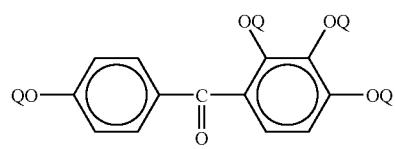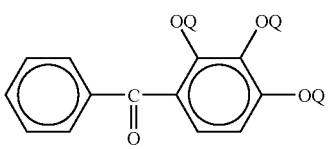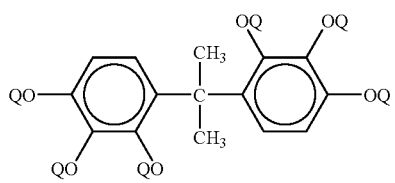
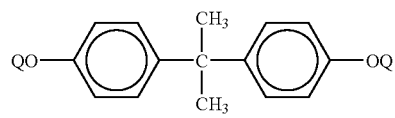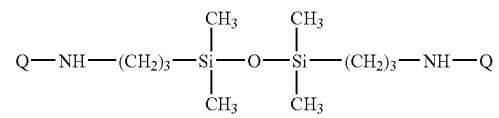
(13)
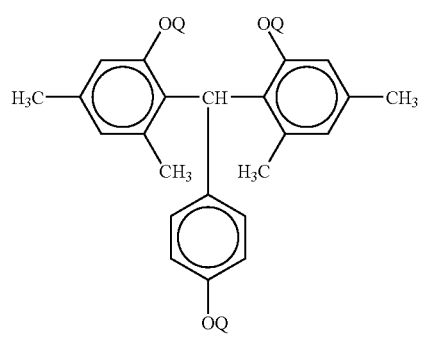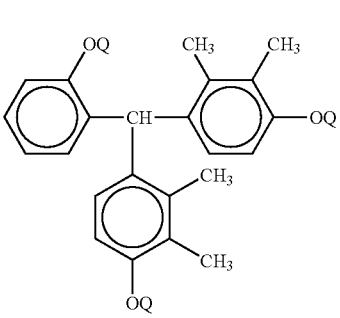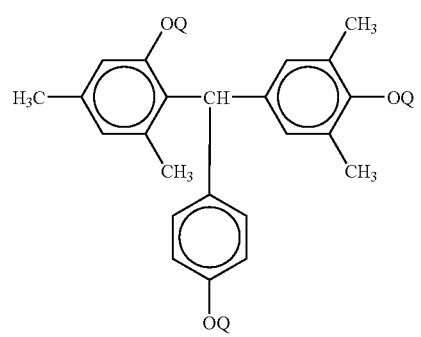
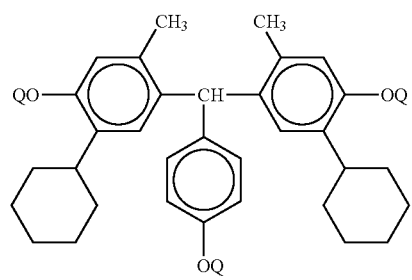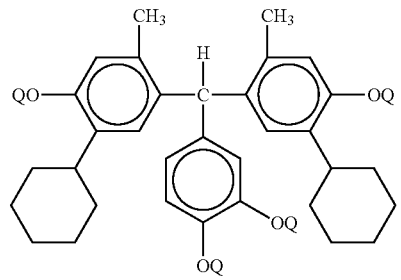
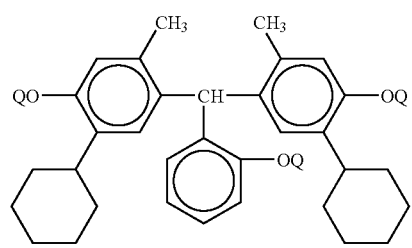
(14)
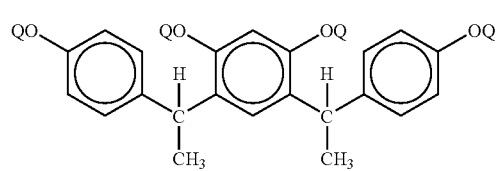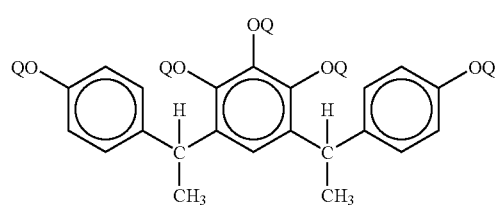
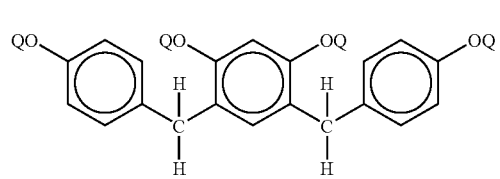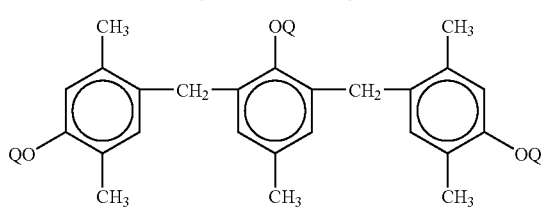

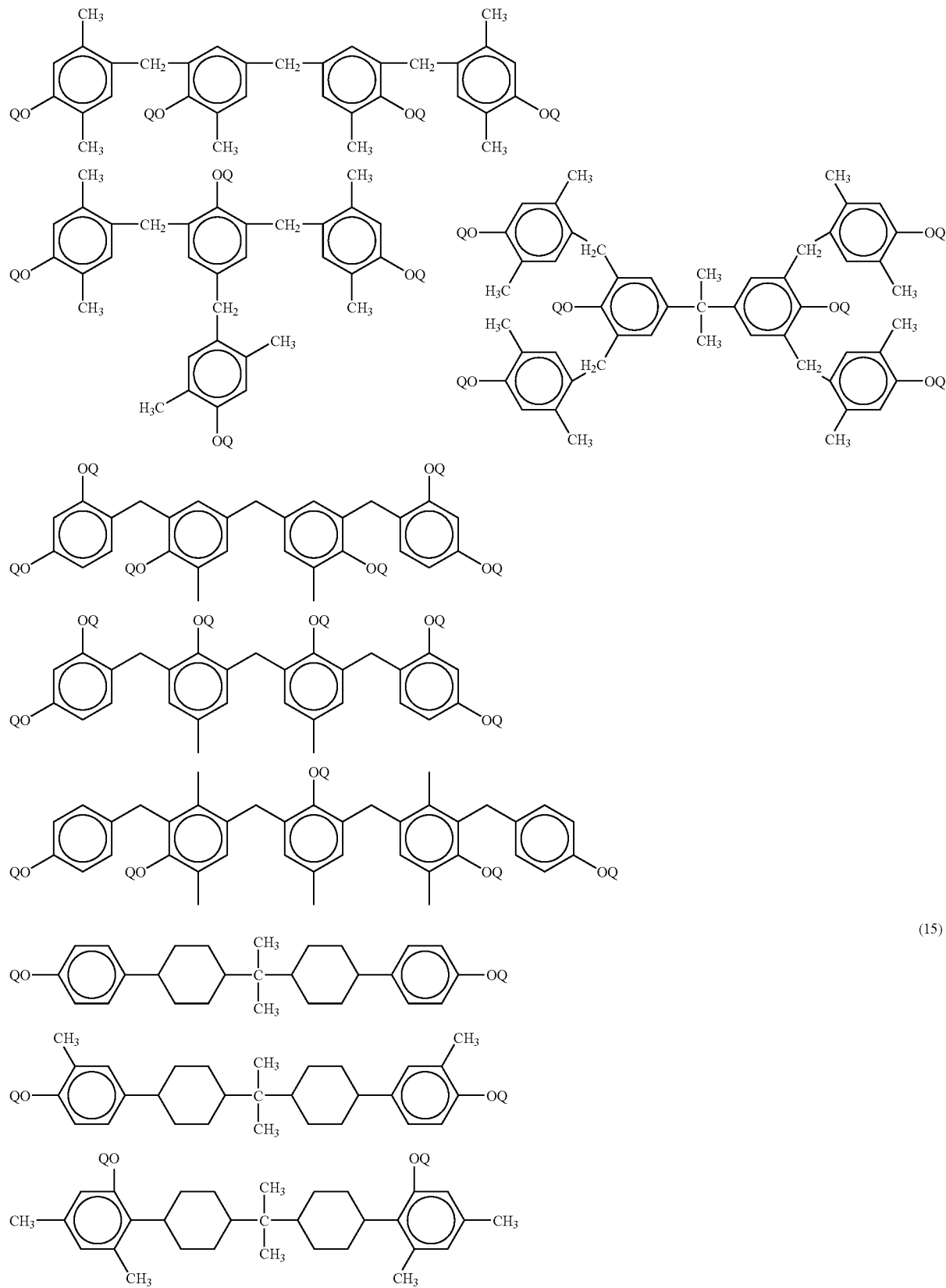
(15)

-continued

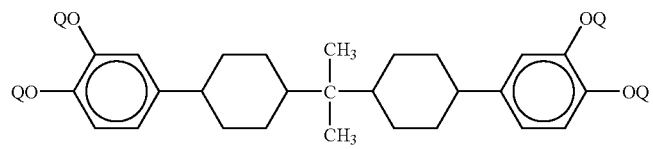

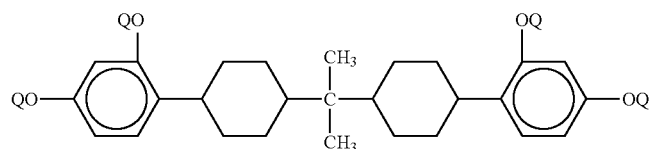

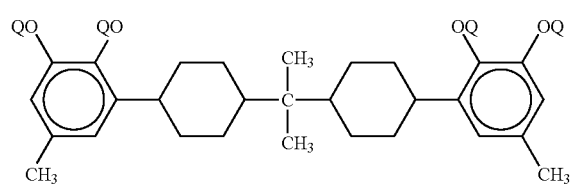

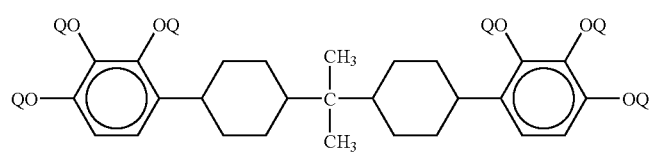

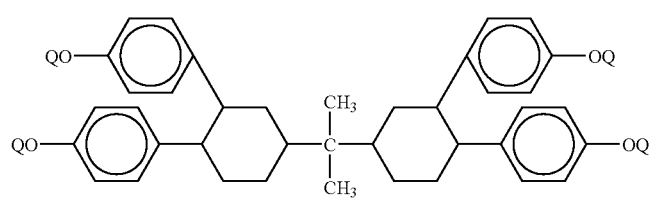

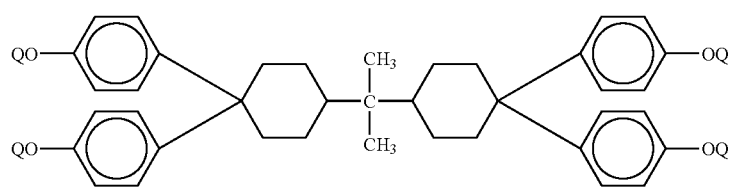

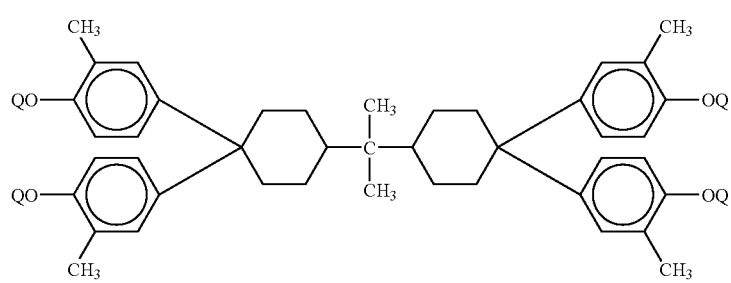

In the formulas (12) to (15), Q is selected from a hydrogen atom, the group shown by the following formula (16), and the group shown by the following formula (17). In the compounds shown in the formulas (12) to (15), at least one Q in each compound is a group shown by the following formula (16) or the following formula (17), and more preferably at least one of Qs in each compound is the group shown by the following formula (17).

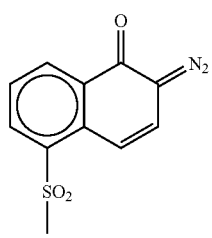

(16)

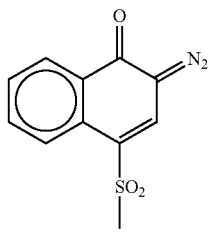

The amount of the sensitizer (B) used in the present invention is preferably 1 to 50 parts by weight for 100 parts by weight of the alkali-soluble resin (A). A more preferable amount is 10 to 40 parts by weight. The addition of the sensitizer (B) in the above range produces a positive-type photosensitive resin composition particularly excelling in sensitivity.

It is important for the positive-type photosensitive resin composition of the present invention to contain a cyclic compound (C) which has an alcoholic hydroxyl group. The cyclic compound (C) improves reliability of the semiconductor device even if the resin is cured at a low temperature. The reason is considered to be that although a phenolic hydroxyl group remains in the alkali-soluble resin (A) when cured at a low temperature because of a low cyclization rate, the phenolic hydroxyl group and the alcoholic hydroxyl group in the cyclic compound (C) react with heat at the time of curing by a dehydration reaction which is catalyzed by the sensitizer. The dehydrated reaction produces ether bonds, which reduce the water absorption rate.

The cyclic compound (C) is preferably either an alicyclic compound or heterocyclic compound, each having at least an alcoholic hydroxyl group. If such a cyclic compound is used, the positive-type photosensitive resin composition is free from decrease in transparency and thus maintains high sensitivity. In addition, a cured layer which maintains transparency after curing can be obtained.

Specific examples of the cyclic compound (C) include, but are not limited to, cyclohexanol, 1-ethynyl-1-cyclohexanol, 1-methylcyclohexanol, 2-methylcyclohexanol, 3-methylcyclohexanol, 4-methylcyclohexanol, 2-ethylcyclohexanol, 4-ethylcyclohexanol, 2-n-propylcyclohexanol, 2-tert-butylcyclohexanol, 4-n-butylcyclohexanol, 4-tert-butylcyclohexanol, 4-amylcyclohexanol, 4-tert-amylcyclohexanol, 2,3-dimethylcyclohexanol, 2,5-dimethylcyclohexanol, 2,6-dimethylcyclohexanol, 3,4-dimethylcyclohexanol, 3,5-dimethylcyclohexanol, 3,3,5-trimethylcyclohexanol, menthol, neomenthol, isomenthol, 2-phenyl-1-cyclohexanol, 4-hydroxycyclohexane carboxylic acid, ethyl-4-hydroxycyclohexane carboxylate, 1-vinylcyclohexanol, dihydrocarveol, terpin, 1,2-cyclohexanediol, 1,3-cyclohexanediol, 1,4-cyclohexanediol, 2,2-bis(4-hydroxycyclohexyl)propane, 4,4-bicyclohexanol, bis(2-hydroxycyclohexyl)methane, bis(3-hydroxycyclohexyl)methane, bis(4-hydroxycyclohexyl)methane, 1,3,5-cyclohexanetriol, 1,2,3-cyclohexanetriol, norborneol, fenchyl alcohol, borneol, isoborneol, hydroxydicyclopentadiene, decahydro-1-naphtol, decahydro-2-naphtol, 1-adamantanol, 2-adamantanol, 2-methyl-2-adamantanol, 2-ethyl-2-adamantanol, 2-butyl-2-adamantanol, 3-methyl-1-adamantanol, 3,5-dimethyl-1-adamantanol, 9H-Tris 2C-PHBA (manufactured by Honshu Chemical Industry Co.), 3-hydroxytetrahydrofuran, 3-hydroxydihydro-2(3H)-furanose, β-hydroxy-γ-butyrolactone, 1,4-anhydroerythritol, 3-hydroxy-4,4-dimethyldihydro-2(3H)-furanose, (3R)-3-hydroxy-4,4-dimethyldihydro-2(3H)-furanose, 2,5-tetrahydrofurandiol, tetrahydrothiophen-3-ol-1,1-dioxide, 3,4-dihydroxytetrahydrothiophene-1,1-dioxide, 3-pyrrolidinol, 1-methyl-3-pyrrolidinol, 4-hydroxy-2-pyrrolidinone, 5-hydroxy-1-methyl-2-pyrrolidinone, 2,6-dihydroxy-D-ribo-hexopyranose, arabinose, tetrahydro-2H-pyran-4-ol, 4-hydroxy-4-methyltetrahydro-2H-pyran-2-on, tetrahydrothiopyran-3-ol, tetrahydro-2H-thiopyran-4-ol, maltol, 1-hydroxypiperidine, 3-hydroxypiperidine, 1-methyl-3-piperidinol, 4-hydroxypiperidine, 1-methyl-4-piperidinol, 3-quinuclidinol, 2-methyl-3-quinuclidinol, 2-hydroxypyridine, 2-hydroxy-5-methylpyridine, 2,4-dihydroxypyridine, 2-quinolinol, 4-quinolinol, 3-iso-quinolinol, 2,4-quinolinediol, 2,6-quinolinediol, 1,5-isoquinolinediol, 3-hydroxypyridine, 5-hydroxy-2-methylpyridine, 4-hydroxypyridine, N-hydroxyphthalimide, N-hydroxysuccinic acid imide, cyanuric acid, and the like. These compounds may be used either individually or in combination of two or more.

As the cyclic compound (C), the compounds shown in the following formula (1) are more preferable.

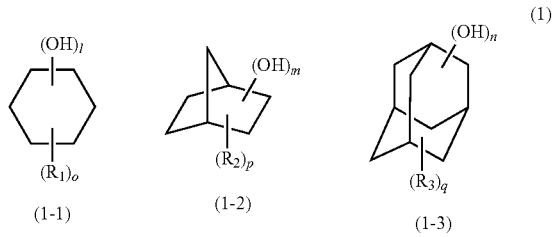

wherein $R_1$, $R_2$, and $R_3$ represent organic groups, when two or more $R_1$s are present, the $R_1$s may be either the same or different, when two or more $R_2$s are present, the $R_2$s may be either the same or different, when two or more $R_3$s are present, the $R_2$s may be either the same or different, l is an integer of 1 to 3, m is an integer of 1 to 3, and n is an integer of 1 to 3, o is an integer of 0 to 3, p is an integer of 0 to 3, and q is an integer of 0 to 3.

The compound shown by the formula (1-1) among the compounds shown in the above formula (1) has a cyclohexane skeleton and the cyclohexane skeleton has 1 to 3 hydroxyl groups and 0 to 3 $R_1$s in any of the positions. The compound shown by the formula (1-2) among the compounds shown in the above formula (1) has a norbornene skeleton and the norbornene skeleton has 1 to 3 hydroxyl groups and 0 to 3 $R_2$s in any of the positions. The compound shown by the formula (1-3) among the compounds shown in the above formula (1) has an adamantane skeleton and the adamantane skeleton has 1 to 3 hydroxyl groups and 0 to 3 $R_3$s in any of the positions.

As specific examples of $R_1$, $R_2$, and $R_3$, an alkyl group, a cycloalkyl group, an aryl group, and the like can be given. Among these, an alkyl group having 1 to 6 carbon atoms which can moderately maintain alkali solubility of the positive-type photosensitive resin composition is preferable in order to obtain a good coating pattern.

As the cyclic compound (C), an alicyclic compound with 6 to 18 carbon atoms having an alcoholic hydroxyl group is preferable. Such an alicyclic compound ensures moderate solubility of the positive-type photosensitive resin composition and formation of a good coating pattern. Particularly preferable cyclic compounds (C) include cyclohexanol, 4-tert-butylcyclohexanol, 1,4-cyclohexanediol, 1-adamantanol, 2-adamantanol, and 3,5-dimethyl-1-adamantanol. These compounds have an additional advantage of excellent solubility in a solvent.

The amount of the cyclic compound (C) used in the present invention is preferably adjusted according to curing conditions, because the curing conditions affect the rate of cyclization of the alkali-soluble resin (A), that is the amount of remaining phenolic hydroxyl groups. More preferably, the cyclic compound (C) is added in an amount to maintain the amount of phenolic hydroxyl groups remaining in the alkali-soluble resin (A) after the reaction with the cyclic compound (C) to less than 20%. Specifically, the cyclic compound (C) is added in an amount of 5 to 30 parts by weight for 100 parts by weight of the alkali-soluble resin (A). A more preferable amount is 5 to 20 parts by weight. If the amount is more than the lower limit, the cyclic compound (C) sufficiently reacts with the hydroxyl group in the alkali-soluble resin (A) and reduces unreacted hydroxyl groups, whereby reliability of semiconductor devices is promoted. If below the upper limit, the composition is dissolved in a solvent in a stable manner without depositing in the later-described varnish. As a result, not only a good coating-layer pattern, but also a good cured layer can be obtained.

Furthermore, the positive-type photosensitive resin composition of the present invention may contain a compound having a phenolic hydroxyl group so as to form a coating layer pattern at high sensitivity without producing a resinous residue (scum).

As a specific structure of such a compound having a phenolic hydroxyl group, the structures shown in the following formula (18) can be given. These compounds may be used either individually or in combination of two or more.

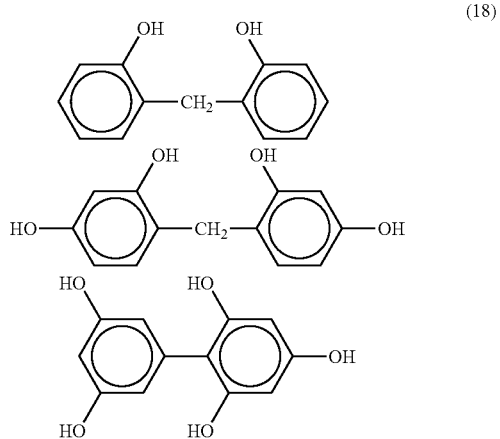

(18)

Although not particularly limited, the compound having a phenolic hydroxyl group is used in an amount of 1 to 30 parts by weight, more preferably 1 to 20 parts by weight for 100 parts by weight of the alkali-soluble resin (A). If the amount of addition is in the above range, production of scum during development is suppressed and dissolution of the exposed area is promoted, resulting in high sensitivity.

The positive-type photosensitive resin composition of the present invention may further contain additives such as an acrylic-type leveling agent, a silicon-containing leveling agent, a fluorine-containing leveling agent, and a vinyl-type leveling agent, a silane coupling agent, and the like, as required, These components are dissolved in a solvent and used in the form of a vanish. As examples of the solvent, N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, and the like can be given. These solvents may be used either individually or in combination of two or more.

When using, the positive-type photosensitive resin composition of the present invention is first applied to an appropriate carrier (substrate) such as a silicon wafer, a ceramic substrate, and an aluminum substrate. When applied to a semiconductor chip, the composition is used in an amount to make a layer with an ultimate thickness of 1.0 to 30 μm after curing. If the thickness is less than the lower limit, it may be difficult for the layer to fully exhibit the function as a surface protection membrane of a semiconductor chip. If more than the upper limit, not only it is difficult to obtain a detailed processing pattern, but also processing will take a long time, resulting in a low throughput. As the method of application, spin coating using a spinner, spray coating using a spray coater, immersion, printing, roll coating, and the like can be given. The coated layer is then prebaked at 60 to 130° C., dried, and irradiated with actinic rays to form a desired pattern. As actinic rays, X rays, electron beams, ultraviolet radiation, visible radiation, and the like having a wavelength of 200 to 500 nm may be preferably used.

Next, the irradiated part is dissolved and removed using a developer to obtain a relief pattern. As examples of the developer, an aqueous solution of alkali compounds such as inorganic alkali compounds such as sodium hydroxide, potassium hydroxide, sodium carbonate, sodium silicate, sodium metasilicate, and ammonia water; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; an aqueous solution obtained by adding an appropriate amount of a water-soluble organic solvent such as an alcohol (such as methanol and ethanol) or a surfactant may be given. As the development method, spraying, paddling, immersion, supersonic waves, and the like may be used.

Next, the relief pattern formed by development is rinsed. Distilled water is used as a rinse. The resulting product is then treated with heat (cured) to form an oxazole ring or an oxazole ring and an imide ring, whereby an ultimate pattern having excellent heat resistance can be obtained.

Either heat treatment at a high temperature or a low temperature is possible. A high temperature treatment is preferably carried out at 280 to 380° C., and more preferably 290 to 350° C. A low temperature treatment is carried out preferably at 150 to 280° C., and more preferably 180 to 260° C.

Next, the cured layer of the positive-type photosensitive resin composition will be described. The cured layer which is a cured product of the positive-type photosensitive resin composition is useful not only for semiconductor devices such as a semiconductor chip, but also display devices such as a TFT liquid crystal and organic EL, an interlayer dielectric of a multilayered circuit, a cover coat of a flexible copper-clad board, a solder resist film, and a liquid crystal alignment film. As examples of the application to semiconductor devices, a passivation layer obtained by forming a cured layer of the positive-type photosensitive resin composition on a semiconductor chip, a protecting layer such as a buffer coat membrane obtained by forming a cured layer of the positive-type photosensitive resin composition on the passivation layer, an insulating layer such as an interlayer dielectric obtained by forming a cured layer of the positive-type photosensitive resin composition on the circuit formed on the semiconductor chip, an α-ray shielding layer, a planarization layer, a projection (resin post), a barrier rib, and the like can be given. As examples of the display device, a protecting layer obtained by forming a cured layer of the positive-type photosensitive resin composition on a display chip, an insulating layer or a planarization layer for a TFT chip or a color filter, a projection for an MVA-type liquid crystal display and the like, a for organic EL chip cathodes and the like can be given. The method of use of the composition for semiconductor devices applies to the method of use for the display devices, that is, a method of forming a patterned layer of the positive-type photosensitive resin composition on a substrate on which a display chip or a color filter is formed may be used. High transparency is required particularly for an insulating layer or a planarization layer of display devices. A resin layer with such excellent transparency can be obtained by introducing a post exposure process before curing the layer of the positive-type photosensitive resin composition. Introduction of such a post exposure process is more preferable in practice.

EXAMPLES

The present invention will be described in detail below.

Example 1

Synthesis of Alkali-Soluble Resin (A-1)

A four-neck separable flask equipped with a thermometer, a stirrer, a raw material inlet port, and a dry nitrogen gas feed pipe was charged with 438.20 g (0.890 mol) of a dicarboxylic acid derivative (active ester), which was obtained by reacting 0.890 mol of diphenyl ether 4,4'-dicarboxylic acid and 1.780 mol of 1-hydroxy-1,2,3-benzotriazole, and 366.26 g (1.000 mol) of hexafluoro-2,2-bis(3-amino-4-hydroxyphenyl)propane. 3,200 g of N-methyl-2-pyrrolidone was added to dissolve the mixture. The mixture was reacted at 75° C. for 16 hours using an oil bath.

Next, 37.87 g (0.220 mol) of 4-ethynylphthalic anhydride dissolved in 150 g of N-methyl-2-pyrrolidone was added and the mixture was stirred for a further three hours to complete the reaction. After filtering, the reaction mixture was poured into a 2:1 (volume ratio) mixture of water and isopropanol. The resulting precipitate was collected by filtration, sufficiently washed with water, and dried under vacuum to obtain the target alkali-soluble resin (A-1).

Synthesis of Sensitizer (B-1)

A four-neck separable flask equipped with a thermometer, a stirrer, a raw material inlet port, and a dry nitrogen gas feed pipe was charged with 11.88 g (0.019 mol) of a phenolic compound shown by the following formula (Q-1) and 5.70 g (0.056 mol) of triethylamine. 68 g of tetrahydrofuran was added to dissolve the mixture. After cooling the reaction mixture to 10° C. or less, 15.13 g (0.056 mol) of 1,2-naphthoquinone-2-diazido-4-sulfonylchloride was slowly added dropwise together with 100 g of tetrahydrofuran while maintaining the temperature at less than 10° C. After stirring for five minutes at 11° C. or less, the reaction mixture was stirred at room temperature for five hours before terminating the reaction. The reaction mixture was filtered and poured into a 3:1 (volume ratio) mixture of water and methanol. The resulting precipitate was collected by filtration, sufficiently washed with water, and dried under vacuum to obtain a sensitizer shown by the following formula (B-1).

[Preparation of Positive-Type Photosensitive Resin Composition]

100 g of the synthesized alkali-soluble resin (A-1), 16 g of the sensitizer which has a structure of the following formula (B-1), and 10.8 g of cyclohexanol as the cyclic compound (C) were dissolved in 170 g of γ-butyrolactone. The solution was filtered through a Teflon® filter with a pore size of 0.2 μm to obtain a positive-type photosensitive resin composition.

Evaluation of Water Absorption

The positive-type photosensitive resin composition was applied to a 6-inch silicon wafer using a spin coater and prebaked on a hot plate at 120° C. for four minutes to obtain a coated layer with a thickness of about 10 μm. The silicon wafer with the coated layer thereon was heated in an oven at 250° C. for 90 minutes. After curing, the coated layer was cut to produce 5 cm×5 cm squares and immersed in a 2% hydrofluoric acid solution to obtain 5 cm×5 cm square films. The water absorption of the film was measured according to JIS-K7209 to find that the coefficient of water absorption was 0.52%.

Evaluation of Solvent Resistance

The thickness of a film coated obtained by curing in the same way as in the evaluation of water absorption was measured. The resulting thickness is referred to as [film thickness before test]. Then, the cured film was immersed in a 3:7 mixture of dimethyl sulfoxide and monoethanolamine at 80° C. for 10 minutes. The cured coated film was then washed with purified water and isopropanol before measurement of thickness after the solvent resistance test. The resulting thickness is referred to as [film thickness after test]. The thickness change before and after the test was determined from the equation: [Residual coating thickness after treatment]=([film thickness after test]/[film thickness before test])×100(%). As a result the residual coating thickness after treatment was found to be 95.2%.

Example 2

Synthesis of Alkali-Soluble Resin (A-2)

A four-neck separable flask equipped with a thermometer, a stirrer, a raw material inlet port, and a dry nitrogen gas feed pipe was charged with 416.73 g (0.880 mol) of a dicarboxylic acid derivative (active ester), which was obtained by reacting 0.700 mol of diphenyl ether-4,4'-dicarboxylic acid, 0.180 mol of isophthalic acid and 1.760 mol of 1-hydroxy-1,2,3-benzotriazole, and 196.21 g (0.700 mol) of 3,3'-diamino-4,4'-dihydroxydiphenyl sulfone and 74.49 g (0.300 mol) of 3,3'-diaminodiphenyl sulfone. 3200 g of N-methyl-2-pyrrolidone was added to dissolve the mixture. The mixture was reacted at 75° C. for 16 hours using an oil bath.

Next, 37.87 g (0.220 mol) of 4-ethynylphthalic anhydride dissolved in 150 g of N-methyl-2-pyrrolidone was added and the mixture was stirred for a further three hours to complete the reaction. After filtering, the reaction mixture was poured into a 2:1 (volume ratio) mixture of water and isopropanol. The resulting precipitate was collected by filtration, sufficiently washed with water, and dried under vacuum to obtain the target alkali-soluble resin (A-2).

[Synthesis of Sensitizer (B-2)]

A four-neck separable flask equipped with a thermometer, a stirrer, a raw material inlet port, and a dry nitrogen gas feed pipe was charged with 9.32 g (0.022 mol) of a phenolic compound shown by the following formula (Q-2) and 6.67 g (0.066 mol) of triethylamine. 65 g of tetrahydrofuran was added to dissolve the mixture. After cooling the reaction mixture to 10° C. or less, 17.72 g (0.066 mol) of 1,2-naphthoquinone-2-diazido-4-sulfonylchloride was slowly added dropwise together with 100 g of tetrahydrofuran while maintaining the temperature at less than 110° C. After stirring for five minutes at 110° C. or less, the reaction mixture was stirred at room temperature for five hours before terminating the reaction. The reaction mixture was filtered and poured into a 3:1 (volume ratio) mixture of water and methanol. The resulting precipitate collected by filtration was sufficiently washed with water and dried under vacuum to obtain a sensitizer shown by the following formula (B-2).

[Preparation of Positive-Type Photosensitive Resin Composition]

100 g of the synthesized alkali-soluble resin (A-2), 18 g of the sensitizer which has a structure of the following formula (B-2), and 19.0 g of 3,5-dimethyl-1-adamantanol as the cyclic compound (C) were dissolved in 180 g of γ-butyrolactone. The solution was filtered through a Teflon® filter with a pore size of 0.2 μm to obtain a positive-type photosensitive resin composition. The positive-type photosensitive resin composition was evaluated in the same manner as in Example 1.

Example 3

Synthesis of Alkali-Soluble Resin (A-3)

A four-neck separable flask equipped with a thermometer, a stirrer, a raw material inlet port, and a dry nitrogen gas feed pipe was charged with 402.88 g (0.850 mol) of a dicarboxylic acid derivative (active ester), which was obtained by reacting 0.680 mol of diphenyl ether-4,4'-dicarboxylic acid, 0.170 mol of isophthalic acid, and 1.700 mol of 1-hydroxy-1,2,3-benzotriazole, and 171.82 g (0.600 mol) of 4,4'-methylenebis(2-amino-3,6-dimethylphenol) and 103.33 g (0.400 mol) of 2,2-bis(3-amino-4-hydroxyphenyl)propane. 3200 g of N-methyl-2-pyrrolidone was added to dissolve the mixture. The mixture was reacted at 75° C. for 16 hours using an oil bath.

Next, 37.87 g (0.220 mol) of 4-ethynylphthalic anhydride dissolved in 150 g of N-methyl-2-pyrrolidone was added and the mixture was stirred for a further three hours to complete the reaction. After filtering, the reaction mixture was poured into a 2:1 (volume ratio) mixture of water and isopropanol to collect a precipitate, which was sufficiently washed with water, and dried under vacuum to obtain the target alkali-soluble resin (A-3).

Synthesis of Sensitizer (B-3)

A four-neck separable flask equipped with a thermometer, a stirrer, a raw material inlet port, and a dry nitrogen gas feed pipe was charged with 10.47 g (0.025 mol) of a phenolic compound shown by the following formula (Q-2) and 6.22 g (0.062 mol) of triethylamine. 65 g of tetrahydrofuran was added to dissolve the mixture. After cooling the reaction mixture to 10° C. or less, 16.52 g (0.062 mol) of 1,2-naphthoquinone-2-diazido-5-sulfonylchloride was slowly added dropwise together with 100 g of tetrahydrofuran while maintaining the temperature at less than 10° C. After stirring for five minutes at 10° C. or less, the reaction mixture was stirred at room temperature for five hours before terminating the reaction. After filtering, the reaction mixture was poured into a 3:1 (volume ratio) mixture of water and methanol. The resulting precipitate was collected, sufficiently washed with water, and dried under vacuum to obtain a sensitizer shown by the following formula (B-3).

[Preparation of Positive-Type Photosensitive Resin Composition]

100 g of the synthesized alkali-soluble resin (A-3), 6.0 g of the sensitizer (B-2) synthesized in Example 2, 7.5 g of a sensitizer having a structure of the following formula (B-3), and 6.5 g of 1,4-cyclohexanediol as the cyclic compound (C) were dissolved in 160 g of γ-butyrolactone. The solution was filtered through a Teflon® filter with a pore size of 0.2 μm to obtain a positive-type photosensitive resin composition. The positive-type photosensitive resin composition was evaluated in the same manner as in Example 1.

Comparative Example 1

A positive-type photosensitive resin composition was prepared and evaluated in the same manner as in Example 2 except that the addition of 3,5-dimethyl-1-adamantanol was omitted.

Structures of (Q-1), (Q-2), (B-1), (B-2), and (B-3) in Examples and Comparative Example, and Table 1 are shown below. The amounts of the alkali-soluble resins, sensitizers, and cyclic compounds added are indicated as part by weight.

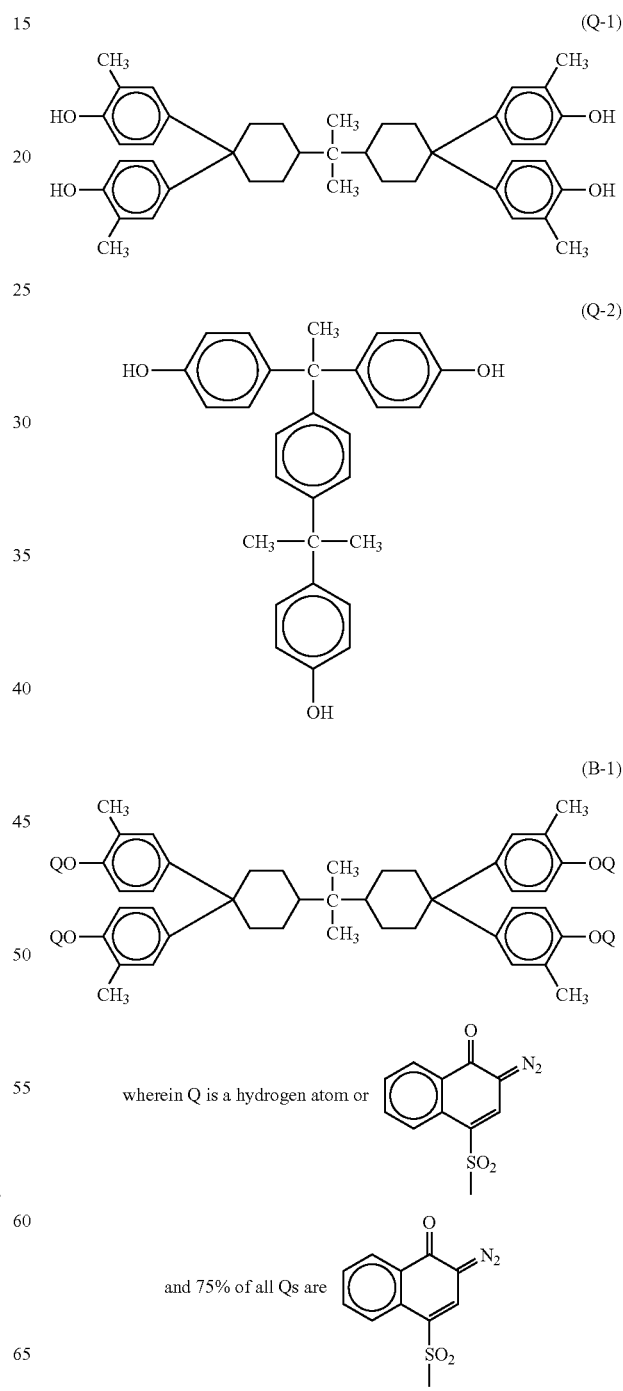

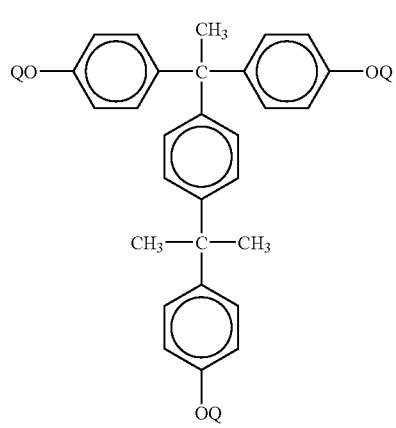

(B-2)

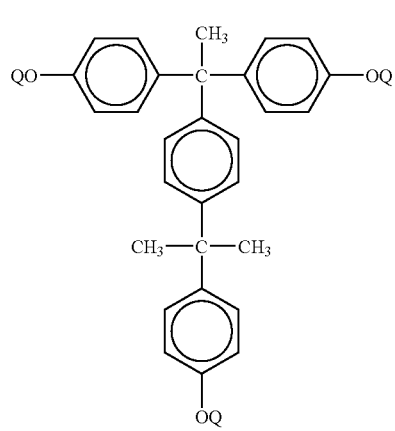

(B-3)

wherein Q is

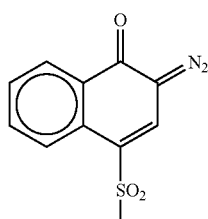

and 100% of all Qs are

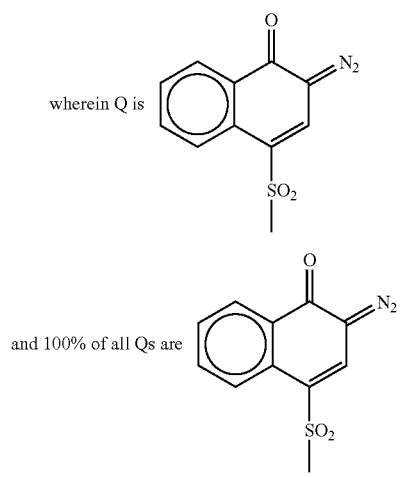

wherein Q is a hydrogen atom or

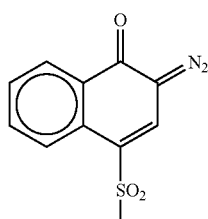

and 83% of all Qs are

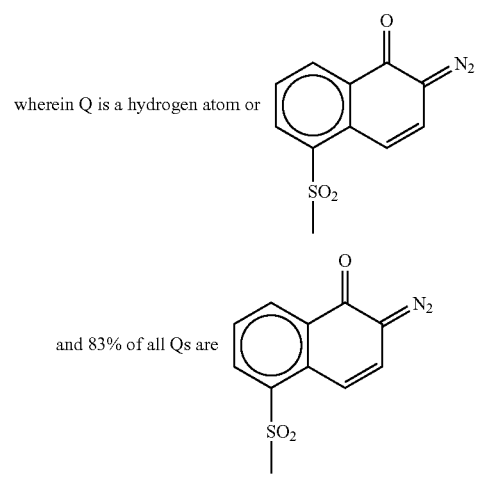

TABLE 1

| | Amount | | | | | |
|---|---|---|---|---|---|---|
| | Alkali-soluble resin (A) (100 g) | | Sensitizer | Cyclic compound (C) | Water | Solvent resistance (residual coating thickness after |
| | Amine (molar ratio) | Acid (molar ratio) | (B) (g) | (g) | absorption (%) | treatment) (%) |
| Example 1 | Hexafluoro-2,2-bis(3-amino-4-hydroxyphenyl)propane (1.00) | Diphenyl ether-4,4'-dicarboxylic acid (0.89) | B-1, 16 | Cyclohexanol 10.8 | 0.52 | 95.2% |
| Example 2 | 3,3'-Diamino-4,4'-dihydroxy-diphenyl sulfone (0.70) 3,3'-Diaminodiphenyl sulfone (0.30) | Isophthalic acid (0.180) | B-2, 18 | 3,5-Dimethyl-1-adamantanol 19.1 | 0.74 | 99.0% |
| Example 3 | 4,4'-Methylenebis(2-amino-3,6-dimethylphenol) (0.60) 2,2-Bis(3-amino-4-hydroxyphenyl)-Propane (0.40) | Isophthalic acid (0.170) Diphenyl ether-4,4'-dicarboxylic acid (0.680) | B-2, 6 B-3, 7.5 | 1,4-Cyclohexanediol 6.5 | 0.50 | 99.8% |
| Comparative Example 1 | 3,3'-Diamino-4,4'-dihydroxy-diphenyl sulfone (0.70) 3,3'-Diaminodiphenyl sulfone (0.30) | Isophthalic acid (0.180) Diphenyl ether-4,4'-dicarboxylic acid (0.700) | B-2, 18 | — | 1.68 | 62.7% |

As shown in Table 1, the cured films of Examples 1 to 3 exhibit not only a very small water absorption rate even when cured at a low temperature, but also a very small change in the film thickness after the solvent resistance test as compared with the cured film of Comparative Example 1, suggesting an effect of increasing reliability of semiconductor devices.

According to the present invention, a positive-type photosensitive resin composition, a cured layer, a protecting layer, and an insulating layer having high reliability when cured at a low temperature, as well as a semiconductor device and a display element can be provided.

What is claimed is:

1. A positive-type photosensitive resin composition comprising:
    an alkali-soluble resin having at least a polybenzoxazole precursor structure;
    a sensitizer; and
    a cyclic compound having an alcoholic hydroxyl group,
    wherein the cyclic compound having an alcoholic hydroxyl group is at least one compound selected from the group consisting of the compounds shown by formulas,

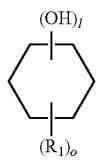 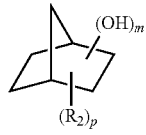 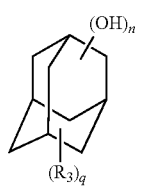  (1)

where $R_1$, $R_2$, and $R_3$ represent organic groups, when two or more $R_1$s are present, the $R_1$s may be either the same or different, when two or more $R_2$s are present, the $R_2$s may be either the same or different, when two or more $R_3$s are present, the $R_3$s may be either the same or different, l, m and n are individually an integer of 1 to 3, and o, p, and q are individually an integer of 0 to 3.

2. The positive-type photosensitive resin composition according to claim 1, wherein the cyclic compound having an alcoholic hydroxyl group is an alicyclic compound with 6 to 18 carbon atoms having an alcoholic hydroxyl group.

3. The positive-type photosensitive resin composition according to claim 1, comprising 5 to 30 parts by weight of the cyclic compound having an alcoholic hydroxyl group for 100 parts by weight of the alkali-soluble resin having a polybenzoxazole precursor structure.

4. The positive-type photosensitive resin composition according to claim 1, wherein the sensitizer is a photosensitive diazo quinone compound.

5. The positive-type photosensitive resin composition according to claim 1, wherein at least a part of the sensitizer is an ester of a phenolic compound and 1,2-naphthoquinone-2-diazido-4-sulfonic acid.

6. A cured layer consisting of the cured product of the positive-type photosensitive resin composition according to claim 1.

7. A protecting layer consisting of the cured layer described in claim 6.

8. An insulating layer consisting of the cured layer described in claim 6.

9. A semiconductor device having the cured layer described in claim 6.

10. A display device having the cured layer described in claim 6.

* * * * *